(12) United States Patent
Amaru et al.

(10) Patent No.: US 9,130,568 B2
(45) Date of Patent: Sep. 8, 2015

(54) CONTROLLABLE POLARITY FET BASED ARITHMETIC AND DIFFERENTIAL LOGIC

(71) Applicant: ECOLE POLYTECHNIQUE FEDERALE DE LAUSANNE (EPFL), Lausanne (CH)

(72) Inventors: Luca Gaetano Amaru, Le Mont sur Lausanne (CH); Pierre-Emmanuel Julien Marc Gaillardon, Renens (CH); Giovanni De Micheli, Lausanne (CH)

(73) Assignee: ECOLE POLYTECHNIQUE FEDERALE DE LAUSANNE (EPFL) (CH)

( * ) Notice: Subject to any disclaimer, the term of this patent is extended or adjusted under 35 U.S.C. 154(b) by 0 days.

(21) Appl. No.: 13/960,964

(22) Filed: Aug. 7, 2013

(65) Prior Publication Data
US 2014/0043060 A1   Feb. 13, 2014

(30) Foreign Application Priority Data
Aug. 9, 2012   (EP) ..................................... 12179928

(51) Int. Cl.
 H03K 19/21   (2006.01)
 H03K 19/23   (2006.01)
 H03K 17/687  (2006.01)
 H03K 19/20   (2006.01)

(52) U.S. Cl.
 CPC .............. *H03K 19/23* (2013.01); *H03K 17/687* (2013.01); *H03K 19/20* (2013.01); *H03K 19/215* (2013.01)

(58) Field of Classification Search
 CPC ... H03K 19/20; H03K 17/687; H03K 19/215; H03K 19/23
 USPC ................................. 326/36, 52–55, 104, 113
 See application file for complete search history.

(56) References Cited

U.S. PATENT DOCUMENTS

| | | | |
|---|---|---|---|
| 7,417,468 B2 * | 8/2008 | Verbauwhede et al. ...... | 326/112 |
| 7,492,015 B2 | 2/2009 | Chen et al. | |
| 7,795,907 B1 | 9/2010 | Wang | |
| 7,894,242 B2 * | 2/2011 | Kuenemund et al. ......... | 365/154 |
| 7,956,669 B2 | 6/2011 | Chuang et al. | |
| 2001/0013797 A1 * | 8/2001 | Hirairi .......................... | 326/113 |
| 2011/0169067 A1 | 7/2011 | Ernst et al. | |
| 2014/0043060 A1 * | 2/2014 | Amaru et al. ................... | 326/36 |

OTHER PUBLICATIONS

Ben-Jamaa et al., "An Efficient Gate Library for Ambipolar CNTFET Logic," IEEE Transactions on Computer-Aided Design of Integrated Circuits and Systems, 2011, vol. 30(2), pp. 242-255.
Colli et al., "Top-Gated Silicon Nanowire Transistors in a Single Fabrication Step," ACS Nano, 2009, vol. 3(6), pp. 1587-1593.
(Continued)

*Primary Examiner* — Vibol Tan
(74) *Attorney, Agent, or Firm* — Sheridan Ross P.C.

(57) ABSTRACT

A logic gate with three inputs A, B, and C, and one output implementing a function MAJ(A,B,C)=A*B+B*C+A*C comprising two mutually exclusive transmission gates (TGs) connected in series, based on two parallel double-gate controllable polarity devices, a polarity of each being controlled by input A and a conduction being controlled by input B, or vice-versa, in opposite polarities, and that route either an input A or C from one side of the transmission gates to the output.

9 Claims, 15 Drawing Sheets

(56) References Cited

OTHER PUBLICATIONS

De Marchi et al., "Polarity Control in Double-Gate, Gate-All-Around Vertically Stacked Silicon Nanowire FETs," Proc. IEDM, 2012, pp. 183-186.

De Marchi et al., "Regular Fabric Design with Ambipolar CNTFETs for FPGA and Structured ASIC Applications," Nanoarch, 2010, 6 pages.

Harada et al., "A polarity-controllable graphene inverter," Applied Phys Letts, 2010, vol. 96:012102, 3 pages.

Heinze et al., "Unexpected scaling of the performance of carbon nanotube Schottky-barrier transistors," Physical Review B, 2003, vol. 68, pp. 235418-1 to 235418-5.

Heller et al., "Cascode Voltage Switch Logic: A Differential CMOS Logic Family," IEEE Int'l Solid-State Circuits Conference, 1984, pp. 16-17.

Jabeur et al., "High performance 4:1 multiplexer with ambipolar double-gate FETs," IEEE Proc., 2011, pp. 677-680.

Kao et al., "MTCMOS Hierarchical Sizing Based on Mutual Exclusive Discharge Patterns," Design Automation Conference Proceedings, Jun. 1998, pp. 495-500.

Kawaguichi et al., "A Super Cut-Off CMOS (SCC-MOS) Scheme for 0.5-V Supply Voltage with Picoampere Stand-By Current," IEEE J. Solid-State Circuits, 2000, vol. 35(10), pp. 1498-1501.

Koo et al., "Enhanced Channel Modulation in Dual-Gated Silicon Nanowire Transistors," Nano Letters, 2005, vol. 5, No. 12, pp. 2519-2523.

Lin et al., "High-performance carbon nanotube field-effect transistor with tunable Polarities," IEEE Transactions on Nanotech., 2005, vol. 4(5), pp. 481-489.

Ng et al., "A New Approach to Fabricate Vertically Stacked Single-Crystalline Silicon Nanowires," IEEE Proc. EDSSC, 2007, pp. 133-136.

Novoselov et al., "Electric Field Effect in Atomically Thin Carbon Films," Science, 2004, vol. 306, pp. 666-669.

Sacchetto et al., "Ambipolar Gate-Controllable SiNW FETs for Configurable Logic Circuits With Improved Expressive Capability," IEEE Electron Device Letts, 2011, pp. 1-3.

Sacchetto et al., "Ambipolar silicon nanowire FETs with stenciled-deposited metal gate," Microelectronic Engineering, 2011, vol. 88, pp. 2732-2735.

Sacchetto et al., "Fabrication and Characterization of Vertically Stacked Gate-All-Around Si Nanowire FET Arrays," IEEE ESSDERC, 2009, 4 pages.

Zukoski et al., "Universal Logic Modules Based on Double-Gate Carbon Nanotube Transistors," Design Automation Conference Proceedings, Jun. 2011, pp. 884-889.

\* cited by examiner

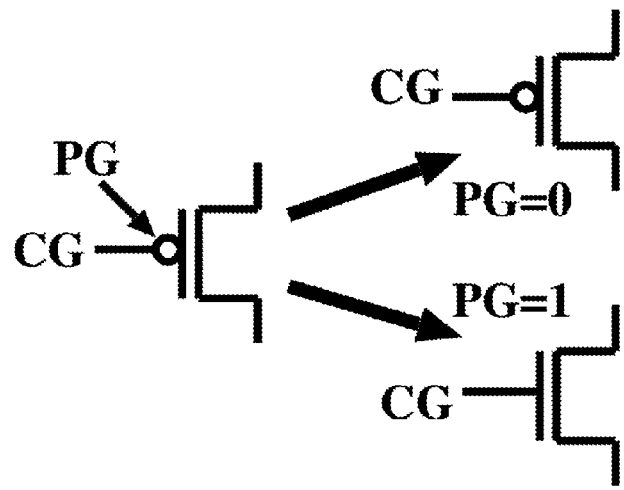
FIG. 1
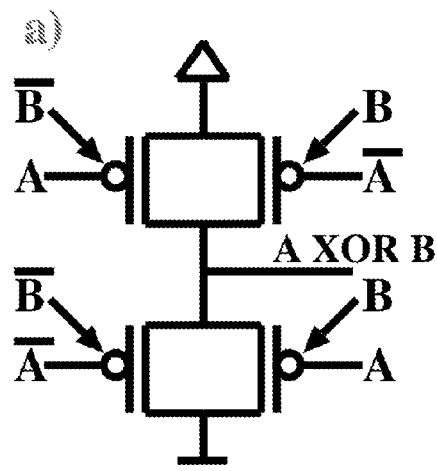 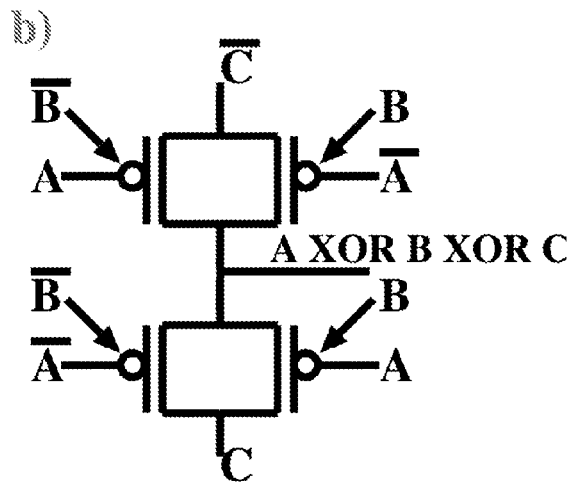
FIG. 2a        FIG. 2b

Unipolar DCVSL gate

Ambipolar DCVSL gate

CONTROLLABLE POLARITY FET BASED ARITHMETIC AND DIFFERENTIAL LOGIC

CROSS-REFERENCE TO RELATED APPLICATIONS

This application claims the benefit of European Patent Application No. 12179928.2 filed Aug. 9, 2012, the entire disclosure of which is incorporated herein by reference.

TECHNICAL FIELD

The invention relates to a majority logic gate based on double-gate controllable polarity Field Effect Transistors (FETs).

The invention further relates to Differential Cascade Voltage Switch Logic (DCVSL) style, which finds use with double-gate controllable polarity Field Effect Transistors (FETs).

BACKGROUND

Ambipolar transistors are Double Independent Gate (DIG) FETs with device polarity controllable via the second gate. DIG ambipolar FETs have been reported in many nano-scale emerging technologies [1]-[5], [13]. In FIG. 1, the polarity control operation is shown: the Polarity Gate (PG) set the device polarity while the Conventional Gate (CG) set the on-state in the usual way.

Recently, several works have proved that DIG ambipolar FETs can be employed to implement complex binate functions with a reduced number of transistors [6,7]. In FIG. 2(a), the 2-input XOR complementary gate proposed in [6] is depicted.

Later in [8], a full swing 3 input XOR gate in Complementary Transmission Gate (CTG) style was proposed (FIG. 2(b)). Other complex gates were proposed in [6] to form an efficient library of ambipolar gates. Ambipolar MUX gates were explored in [9] showing remarkable savings with respect to unipolar technology. Despite these gates can be employed to obtain denser and faster circuits, none has been proposed to efficiently implement unate functions in ambipolar technology, missing further optimization opportunities.

Differential Cascade Voltage Switch Logic (DCVSL) is a differential style that provides complementary outputs given true and complementary inputs. Technologies that are efficient for binate-logic intensive circuits, such as ambipolar technologies, get extra benefits from DCVSL style.

Ambipolar Technologies

Ambipolar Double Independent Gate (DIG) devices are transistors that can be configured as p-type or n-type applying a specific voltage on the additional gate [1,5],[13]. Ambipolar DIG transistors have been fabricated in many novel technologies such as carbon nanotubes [1], graphene [2] and Silicon Nanowires (SiNWs) [3A], [5]. The gate controlling device polarity is often called Polarity Gate (PG) and the other Conventional Gate (CG). As already introduced herein above, in FIG. 1, the on-line polarity configuration of a DIG ambipolar transistor is shown.

Ambipolar DIG devices can be employed to implement complex binate functions with a reduced number of transistors [6,9]. However, a critical problem with complementary gates implementing binate functions is the short circuit current. If the binate variable A is generated inverting !A, or vice versa, there exists a non-zero overlapping time for A and !A. This causes a temporarily direct current conduction from $V_{cc}$ to $V_{ss}$. In addition, the inverter for A affects the overall circuit delay.

Differential Cascade Voltage Switch Logic Style

A generic DCVSL gate is depicted in FIG. 8. Two Pull-Down (PD) networks implement f and !f respectively. At any time, one and only one of these PD networks is active. Therefore, the active PD branch is pulled to $V_{ss}$ and turns on the p-type transistor above the inactive PD network. This process automatically turns off the p-type transistor above the active PD network. The feedback in DCVSL is stable and regenerative with an appropriate transistor sizing. The DCVSL style advantage is the logic density achievable by having complex logic trees in one stage delay. Further efficiency comes from the elimination of large p-type transistors in the Pull-Up (PU) network. Regarding power consumption, DCVSL generates simultaneous outputs reducing short circuit currents in successive binate gates. Moreover, DCVSL offers implicit noise immunity by construction [8A]. However, these advantages are achieved at cost of the extra logic needed to generate complementary inputs. With binate functions that require both input polarities in any possible implementation, DCVSL becomes the best logic style choice.

Power Gating

Power consumption is a serious issue with advanced nano-scale devices. Among them, ambipolar devices target binate functions (e.g. XOR) that intrinsically have a high switching activity; hence the problem is even exacerbated. In these circumstances, low power techniques play an important role in supporting nano-scale emerging technologies. Power gating is a well-known technique where a sleep transistor is placed in series with a logic block [9A], [10A]. This transistor is typically a header and is placed between the logic block and $V_{cc}$. When the transistor is on, the logic block is in the active mode. When the transistor is off, the logic block is in the standby mode and it is disconnected from its power supply rail. In this mode the dynamic power consumption should be zero, or very small, and the static power consumption is reduced. However, power gating presents also drawbacks. In the active mode, the sleep transistor lowers the supply voltage reducing the logic block performance. In the standby mode, outputs are floating and may lead to large short circuit currents in successive blocks. DIG transistors were shown to alleviate some power gating drawbacks [11A].

SUMMARY OF INVENTION

In a first aspect, the invention provides a logic gate with three inputs A, B, and C, and one output implementing a function MAJ(A,B,C)=A*B+B*C+A*C comprising two mutually exclusive transmission gates (TGs) connected in series, based on two parallel double-gate controllable polarity devices, a polarity of each being controlled by input A and a conduction being controlled by input B, or vice-versa, in opposite polarities, and that route either an input A or C from one side of the transmission gates to the output.

In a preferred embodiment, the output is a node where the two transmission gates are connected.

In a further preferred embodiment, the two transmission gates are replaced by pass gates (PGs) based on single double-gate controllable polarity devices controlled by inputs A and B.

In a second aspect, the invention provides a Full-Adder comprising a XOR-3 gate and the logic gate according to the first aspect. The XOR-3 gate is based on further transmission gates (TGs) that route either the input C or an input C' from one side of the further transmission gates to a further output.

In a further preferred embodiment, the further output is a node where the two further transmission gates are connected.

In a further preferred embodiment of the Full-Adder, the two transmission gates are replaced by Pass-Gates (PGs) based on controllable polarity double-gate devices.

In a third aspect, the invention provides a vertical stack implementation of Full-Adders, wherein the double-gate controllable polarity devices for XOR-3 and majority are vertically stacked and sharing the same gate-input signals.

In a fourth aspect, the invention provides a circuit in Differential Cascade Voltage Switch Logic (DCVSL) style, presenting power gating capabilities, comprising two mutually exclusive pull-down networks, each consisting of either standard unipolar or double-gate controllable polarity devices; two n-type transistors driven by a sleep signal, placed in parallel to the pull-down networks; and two double-gate controllable polarity transistors used as pull-up devices, wherein the first gate is used for the standard differential logic feedback and the second gate is driven by a sleep signal.

In a fifth aspect, the invention provides a cascade implementation of power-gated circuits comprising an alternating use of the DCVSL circuit according to the fourth aspect and standard non-power-gated DCVSL style circuits.

BRIEF DESCRIPTION OF THE DRAWINGS

The invention will be better understood in light of the description of preferred embodiments and in reference to the figures, wherein FIG. 1 illustrates DIG ambipolar FET polarity control;

FIG. 2 shows two and three inputs Ambipolar XOR gates proposed in [6] and [8], respectively;

DESCRIPTION OF EXAMPLE EMBODIMENTS OF THE INVENTION

Ambipolar Majority Gate

The present invention concerns a novel 3-input Ambipolar Majority gate. With respect to a novel FinFET realization of the Majority gate in [14], the described Ambipolar Majority gate avoids series stacking of transistors making the relative gate smaller and faster. Moreover, we only need the complementary signals of 2 inputs over 3 while in [14] all the 3 inputs need to be complemented. The description further describes an example embodiment wherein the inventive Ambipolar Majority gate is employed to efficiently design a Full-Adder. The proposed Ambipolar Majority Gate enables an advantageous realization of the Full-Adder with Vertically Stacked Nanowires (VSN).

The 3-input majority function has the following minimal Sum Of Product (SOP) representation:

Maj($a,b,c$)=$ab+bc+ac$

This can be rewritten using the XOR operation as:

Maj($a,b,c$)=$(a \oplus b)c+(a \oplus b)'a$

With x(a,b)=$a \oplus b$, it becomes

Maj($a,b,c$)=$x(a, b)c+x(a, b)'a$

Figure 3:
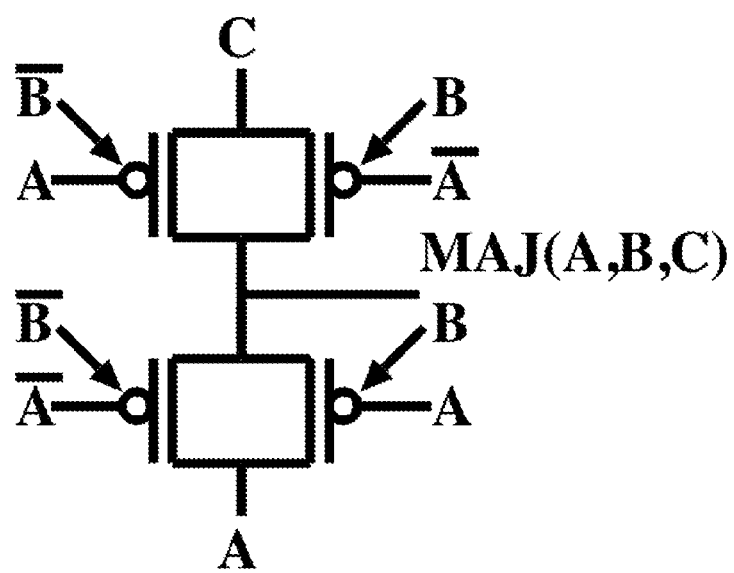
FIG. 3 shows a 3-input ambipolar Majority gate.

This form suggests to use a CTG style to pass a or c depending on x(a, b). The gate in FIG. 2(*a*) has Pull-Up (PU) and Pull-Down (PD) networks that are good at passing both $V_{cc}$ and $V_{ss}$ [6]. Replacing $V_{cc}$ and $V_{ss}$ in that gate with c and a as input variables respectively, enables a compact realization of Maj(a,b,c) (FIG. 3).

The number of transistors needed is 4 for the CTGs and another 4 for A and B respective inverters. The gate has rail to rail voltage swing. It is possible to further reduce the number of transistors permitting one threshold voltage loss: the right (or left) part can be eliminated and the corresponding output voltage swing becomes $V_{cc}-V_{tn}$ to $V_{ss}+|V_{tp}|$.

In this case only 2 transistors are needed for the gate and another 2 for the A (or B) inverter. It is also possible to restore the output voltage with an inverter and obtain a minority (complementary of majority) gate at a cost of 6 transistors.

Ambipolar Full-Adder

The Full-Adder logic function is:

Sum=$a \oplus b \oplus c$

Cout=Maj(a, b, c)

The full voltage swing ambipolar Majority gate can implement the function Cout with 4 transistors. The 3-input full voltage swing ambipolar XOR gate in FIG. 2(*b*) implements the function Sum with 4 transistors. Input variables a, b and c need to be inverted so other 6 transistors are required. Total cost of the rail to rail voltage swing Full-Adder (FIG. 5) built with these gates (and inverters) is 14 transistors. The corresponding implementation with complementary pass transistor logic in unipolar technology requires 28 transistors.

Figure 5:
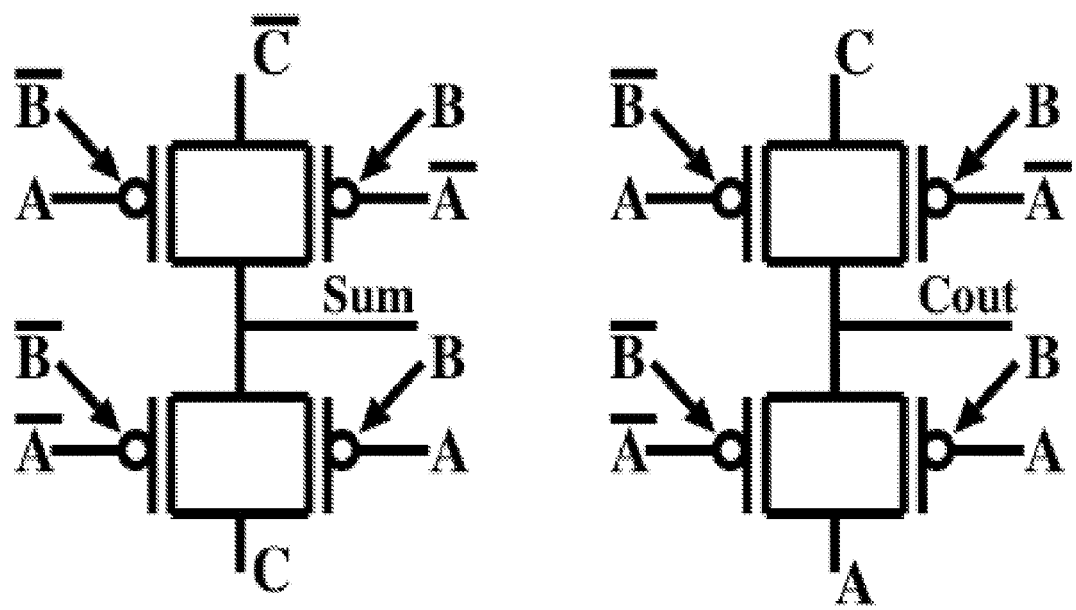
FIG. 5 contains an illustration of Flash Memories presented in [12]

The structure in FIG. 5 is very regular: the only difference between Sum and Cout gates stands in the power signals connection. Therefore, this Full-Adder presents advantages also for the layout and the fabrication processes. In the next section we will discuss how this can be exploited with VSN technology.

Figure 6:
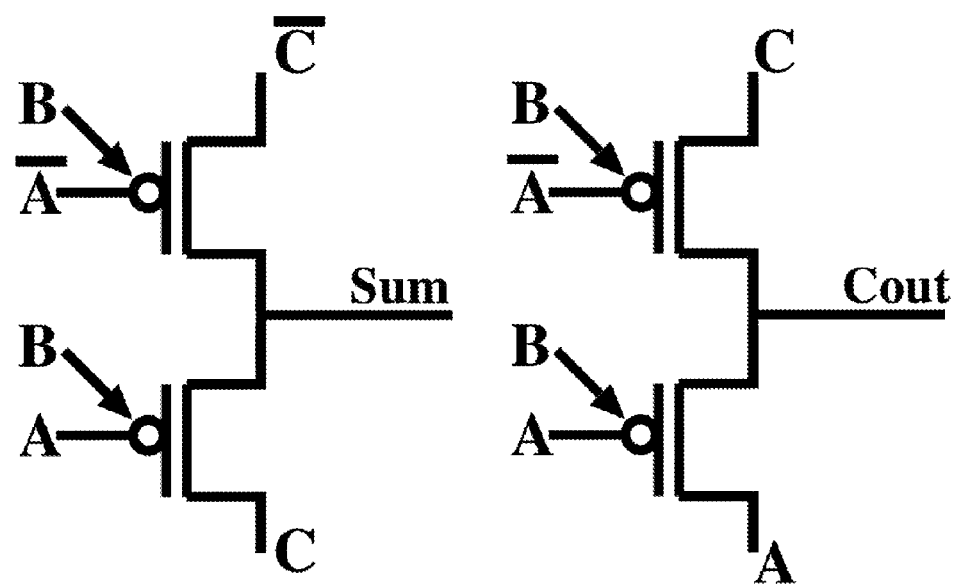
FIG. 6 shows a Reduced voltage swing ambipolar Full-Adder.

It is possible to have a reduced voltage swing Full-Adder eliminating the right (or left) part of Cout and Sum gates. The resulting Full-Adder (FIG. 6) has 8 transistors with output voltage swing $V_{cc}-V_{tn}$ to $V_{ss}+|V_{tp}|$.

Electrical Simulations in Ambipolar SiNWEET Technology

Figure 7:
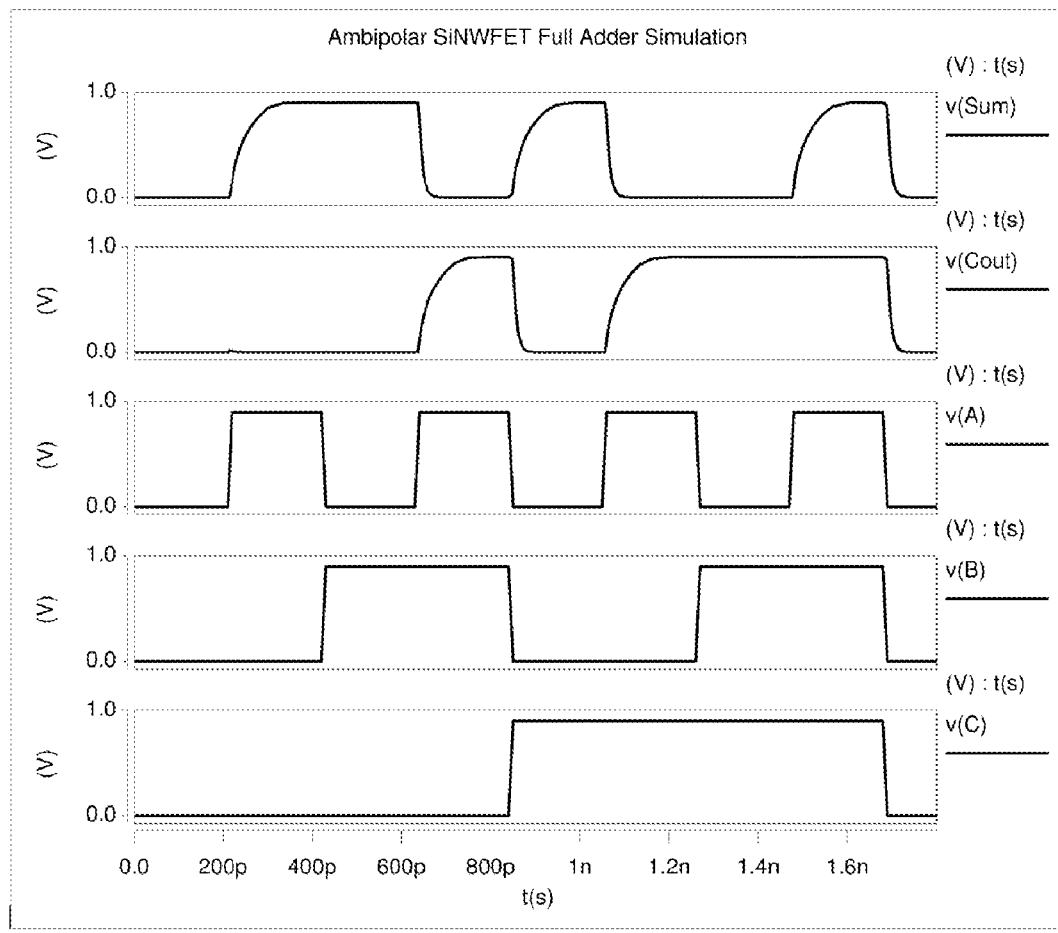
FIG. 7 shows transient curves for the proposed full-voltage swing full adder in DG-SiNWFET Ambipolar technology, gate length 24 nm.

Ambipolar transistors may advantageously be fabricated using SiNWFET technology. For electrical simulation purposes, a compact Verilog-A model is derived from TCAD simulation of an ambipolar DIG SiNWFET with 24 nm long gates. Such model is then run in the HSPICE simulator engine. The supply voltage is 0.9 V. FIG. 7 depicts transient curves of the proposed ambipolar SiNW full-adder and confirms the correct behavior of the designed circuit.

For the sake of comparison, static and transmission-gate (TG) CMOS full-adder are considered in high-performance FinFET technology (PTM model).

Table I summarizes the results for static, TG-CMOS and ambipolar SiNW realizations of the full-adder function. The ambipolar SiNW full adder is 25% faster than TG-CMOS and 64% than the static CMOS. Moreover, the ambipolar SiNW full adder requires 71% and 43% less area than its static and TG-CMOS counterparts, respectively.

TABLE I

Full Adder Simulation Results

| Technology | Ambipolar SiNW | FinFET HP (TG) | FinFET HP (Static) |
|---|---|---|---|
| Transistor Count | 8 | 14 | 28 |
| Vdd | 0.9 V | 0.9 V | 0.9 V |
| Gate Length | 24 nm | 24 nm | 24 nm |
| Load Capacitance | 0.5 fF | 0.5 fF | 0.5 fF |
| Cout w.c. $t_{50\%}$ | 14.48 ps | 18.58 ps | 40.95 ps |
| Sum w.c. $t_{50\%}$ | 13.87 ps | 17.15 ps | 57.62 ps |

Vertically Stacked Ambipolar Nanowire Full-Adder Realization

VSN technology allows to achieve superior performance channel devices [10,11]. Moreover, VSN has been used for 3D integration of memory devices. In [12], the 3D VSN memory concept has been proposed (FIG. 4(b)), where each vertical bit-line can be accessed independently. This is made possible by superlattice epitaxy and selective etching.

Figure 4A:
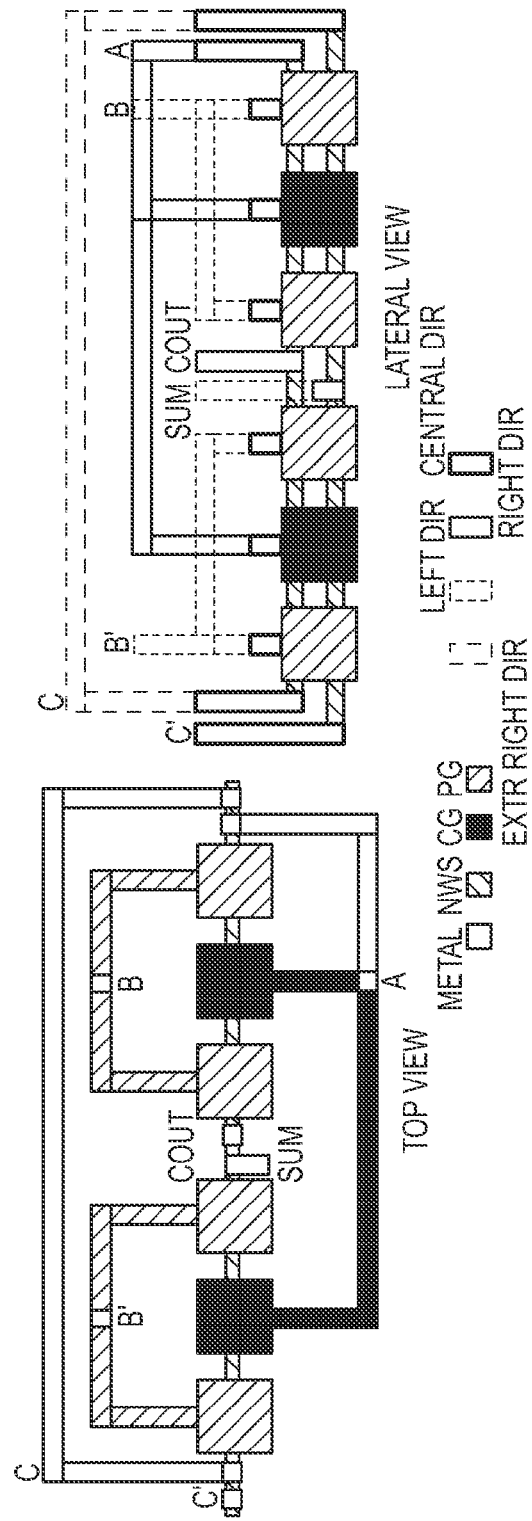
FIG. 4 shows Vertically Stacked Nanowires for 3D integration, whereby (a) is a proposed reduced voltage swing Full-Adder with Ambipolar VSN, and (b) Flash Memories presented in [12]
Figure 4B:
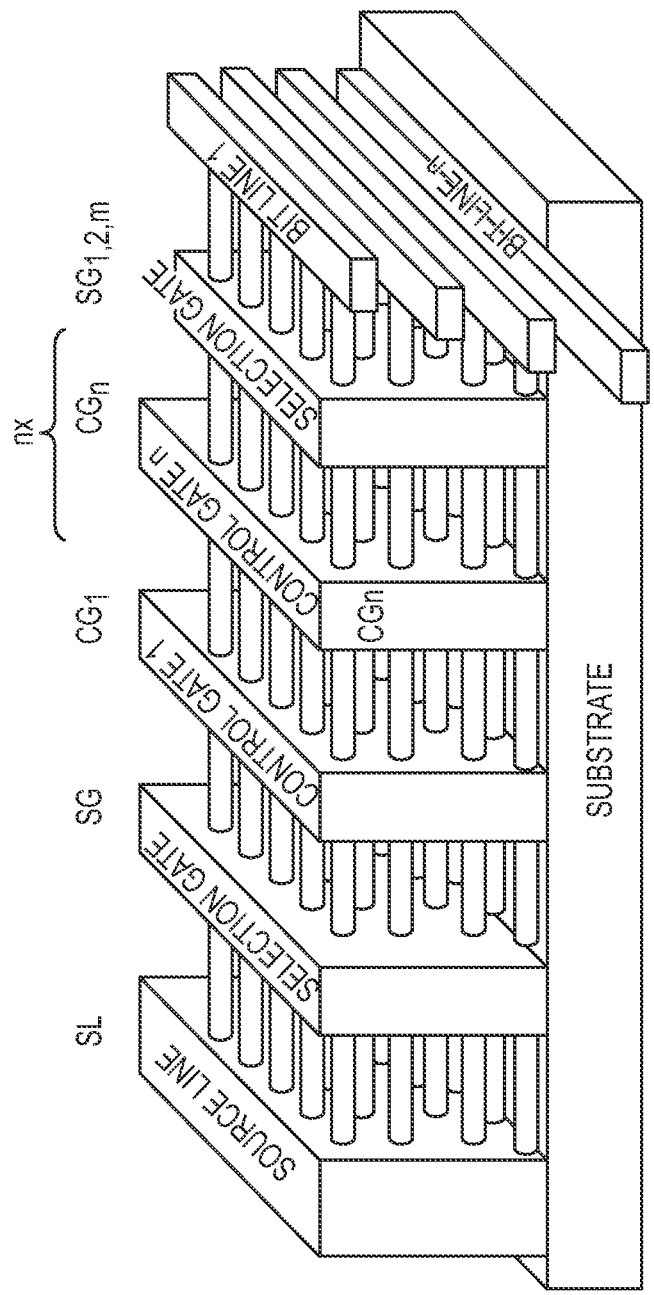

Ambipolar DIG FETs can take advantage of VSN technology using either the enabled enhanced electrostatic properties [10,11] or the 3D integration possibility [12]. In this work, we employ Ambipolar VSN FETs for 3D integration of a Full-Adder circuit. The full voltage swing Full-Adder in FIG. 5 can be obtained with two parallel reduced voltage swing Full-Adders in FIG. 6. For this reason, we consider the realization with Ambipolar VSN FETs of the Full-Adder in FIG. 6. Sum and Cout share the same structure except for outputs and power rail signals. Therefore, two VSN may implement Sum and Cout sharing the CGs and PGs but remaining separated by an insulation layer in the rest of the two nanowires. Physics properties and fabrication processes for a similar 3D structure, but targeting Flash memories, has been explored in [12]. In FIG. 4(a), the conceptual VSN structure for the ambipolar reduced voltage swing full-adder is depicted. Only two vertically stacked nanowires are required to implement the Full-Adder logic function. Sum and Cout output signals and C and A input signals require metal connections inside the cell. Placement of PG and CG in the nanowire is maintained the same as in [5].

DCVSL Style

The following paragraphs describe how DCVSL style is advantageously employed with DIG ambipolar transistors. A novel paradigm for DIG ambipolar transistors as hybrid power/logic switch is introduced. Furthermore in the following paragraphs, we propose a power gating technique for Ambipolar DCVSL (ADCVSL) gates. The proposed technique addresses the limitations of power gating with minimum additional resources discussed in the background section herein above. Indeed, with respect to latest power gating techniques employing double gate FETs in [11A], we avoid series stacking of transistors and floating output thanks to the particular configuration of ambipolar devices shown in the next section.

Ambipolar DCSVL Gate

DIG ambipolar transistors are efficient in implementing binate functions such as XOR and MUX. For this reason arithmetic circuits, that contain many XORs and MUXes, have a compact realization with DIG ambipolar devices. On top of that, employing DCVSL style enables further improvements in area, speed and power consumption. For arithmetic circuits, DCVSL style has a negligible extra cost due to the high density of binate functions. PD networks in an ADCVSL gate are built with the same approach as complementary gates in [6]. ADCSVL Pull-Up Transistors (PUTs) are ambipolar devices with fixed p-type polarity.

Hybrid Power/Logic Switch with Ambipolar Transistor

Figure 8:
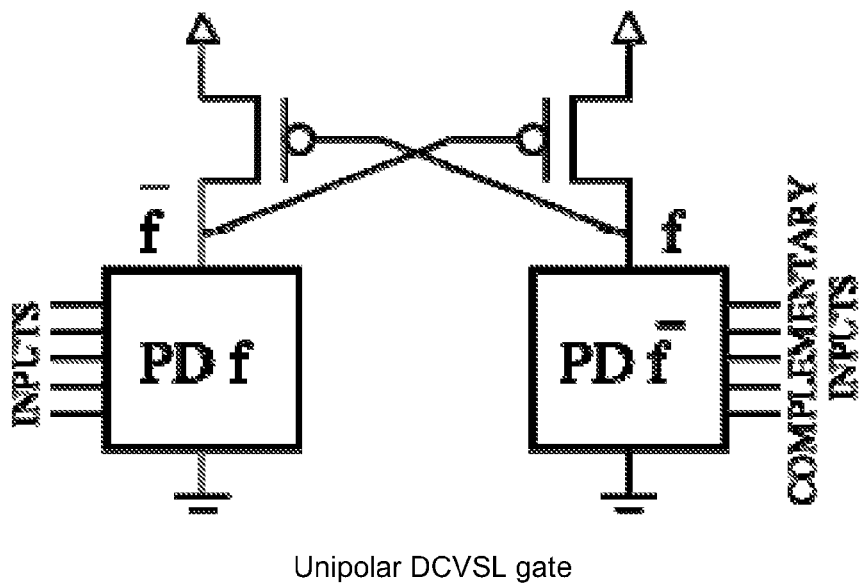
FIG. 8 shows examples of a unipolar DCVSL gate and an ambipolar DCVSL gate.
Figure 8:
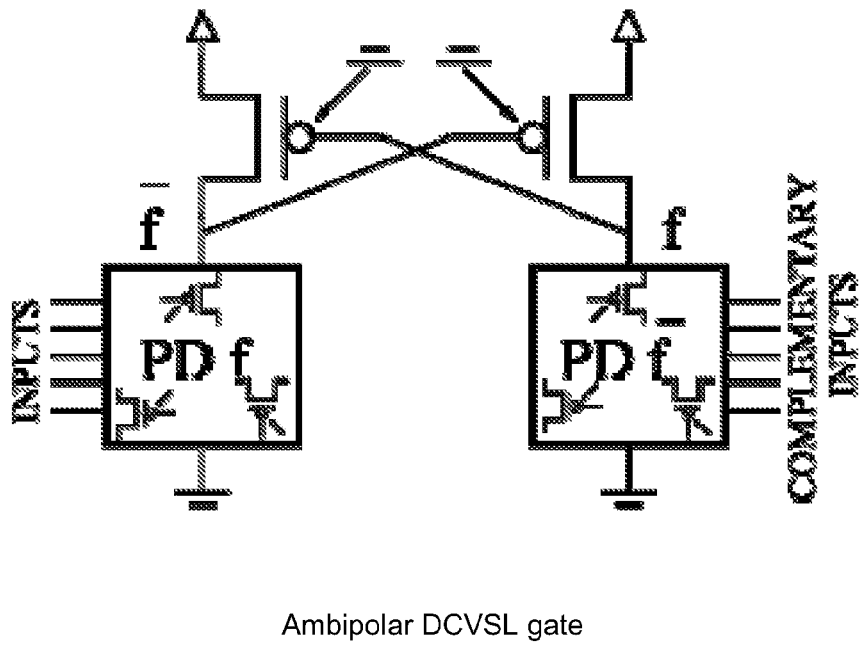
Figure 9:
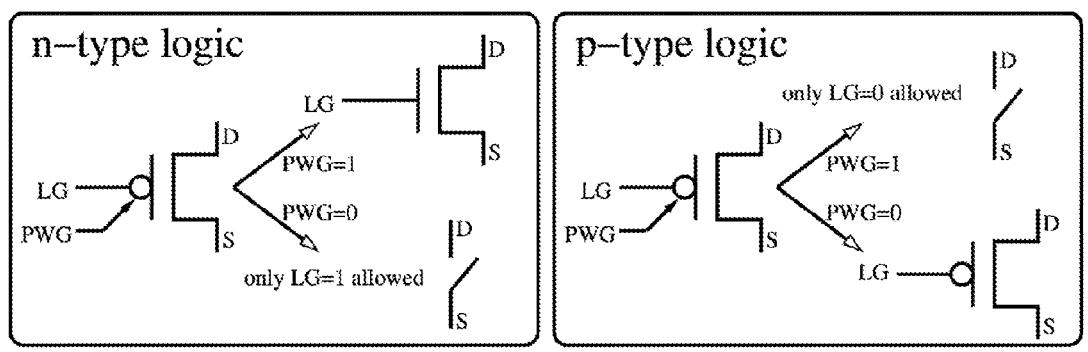
FIG. 9 illustrates a hybrid power/logic switch with ambipolar transistor.

Motivated by the inefficient use of ambipolar PUTs in FIG. 8, we define a novel approach to exploit the ambipolarity of devices as described in a section herein above. The idea is to use a gate as power switch and the remaining one as logic switch. In these circumstances the two DIGs become the PoWer Gate (PWG) and the Logic Gate (LG). Given that the logic circuit generating PWG and LG cannot produce certain gates combinations, the configurations in FIG. 9 are equivalent to a hybrid power/logic switch. A single mixed power/logic switch can act as sleep transistor and logic transistor at the same time.

With asymmetric ambipolar devices, the PWG must be assigned to the gate that shows the best electrostatic control of the transistor.

Ambipolar DCSVL gate with Embedded Power Gating

Figure 10:
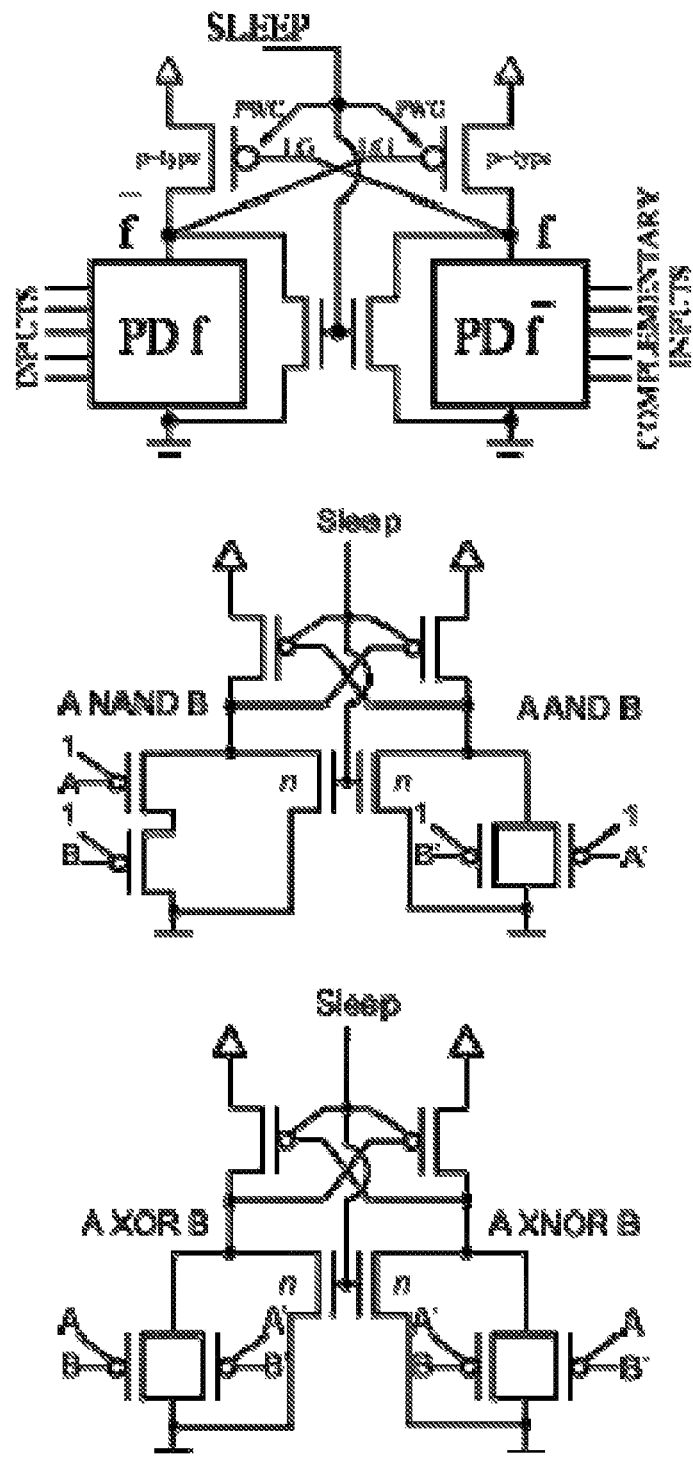
FIG. 10 shows an ambipolar DCSVL gate, and examples, with embedded power gating.
Figure 11:
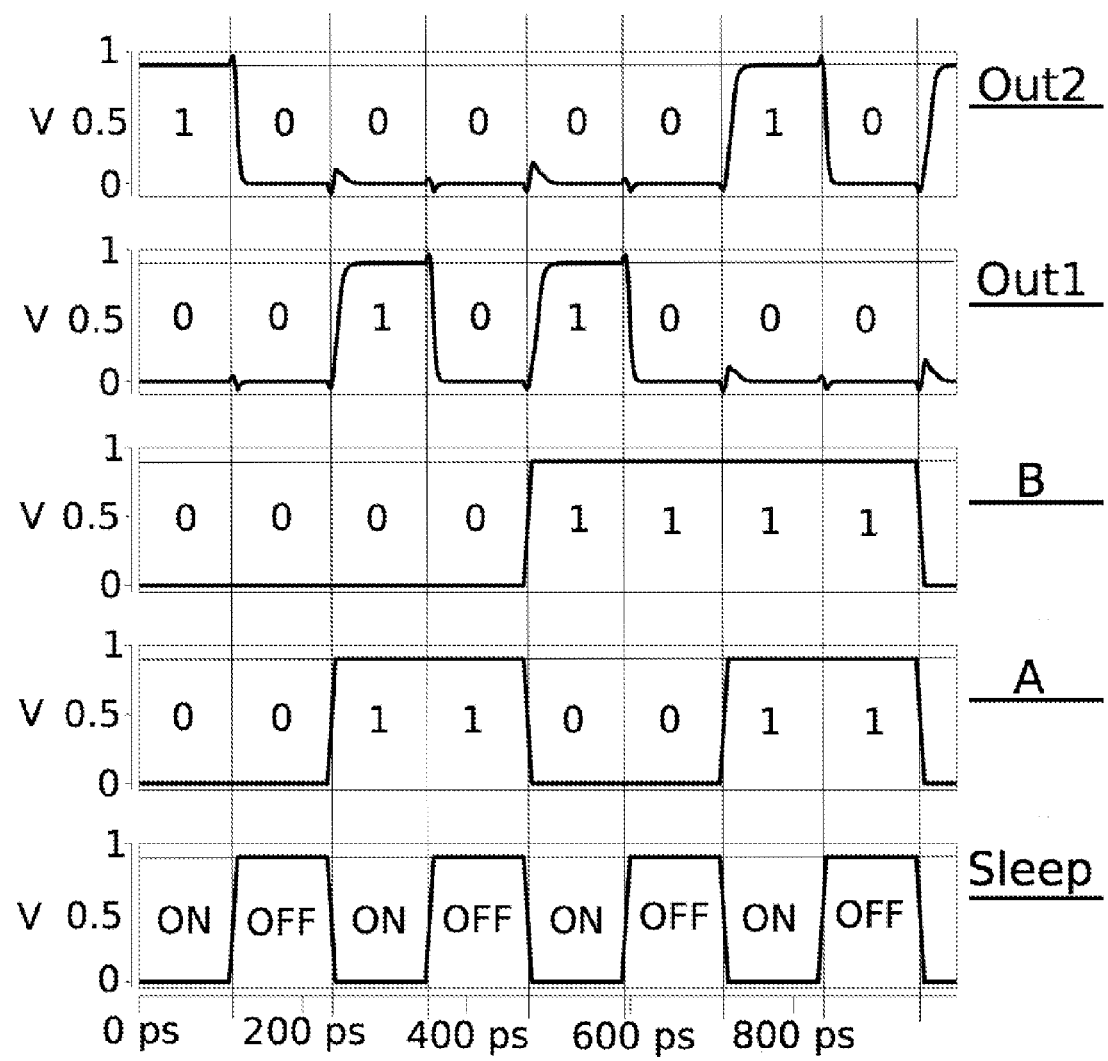
FIG. 11 illustrates an electrical simulation for an ADCSVL XOR/XNOR-2 gate with embedded power gating. Ambipolar technology considered: DG-SiNWFETs, gate length 24 nm.

In FIG. 10(a), the ADCSVL gate with embedded power gating is shown. PUTs are p-type, ambipolar device based, hybrid power/logic switches. Two n-type transistors are employed to guarantee that PWG=LG=1 never happens. In FIG. 10, also an example of AND/NAND and XOR/XNOR ADCVSL power-gated logic circuits are shown.

The operation of the proposed gate is as follows. When SLEEP=0, n-type transistors are off and PUTs are p-type transistors. The gate behaves as a standard ADCVSL gate. When SLEEP=1, n-type transistors are on and pull f and f' nodes to $V_{ss}$. Given that the two n-type transistors are sized to be stronger than PUTs, no voltage conflict occur. In fact, with SLEEP=PWG=1 and f=f'=LG=0 the PUTs are in the off state. This is the only stable and regenerative condition. Power gating in the proposed ADCVSL gate is achieved at the cost of 2 extra n-type transistors. No series stacking of sleep transistors is needed.

Correctness of the Power-Gating Technique in Ambipolar DG-SiNWFET Technology

The correctness of the proposed power-gating technique is evaluated with ambipolar DG-SiNWFET technology. For electrical simulation purposes, a compact Verilog-A model is derived from TCAD simulation of an ambipolar DG SiNWFET with 24 nm long gates. Such model is then run in the HSPICE simulator engine. The supply voltage is 0.9 V. FIG.

11 depicts transient curves of the ADCVSL XOR/XNOR-2 power-gated by the proposed configuration. The correct behavior of the circuit (XOR/XNOR-2 function) is noted when Sleep=0 (active mode) while when Sleep=1 (stand-by mode) both outputs assume the logic 0 value regardless of the other inputs.

Cascading Power-Gated Cells

Figure 12:
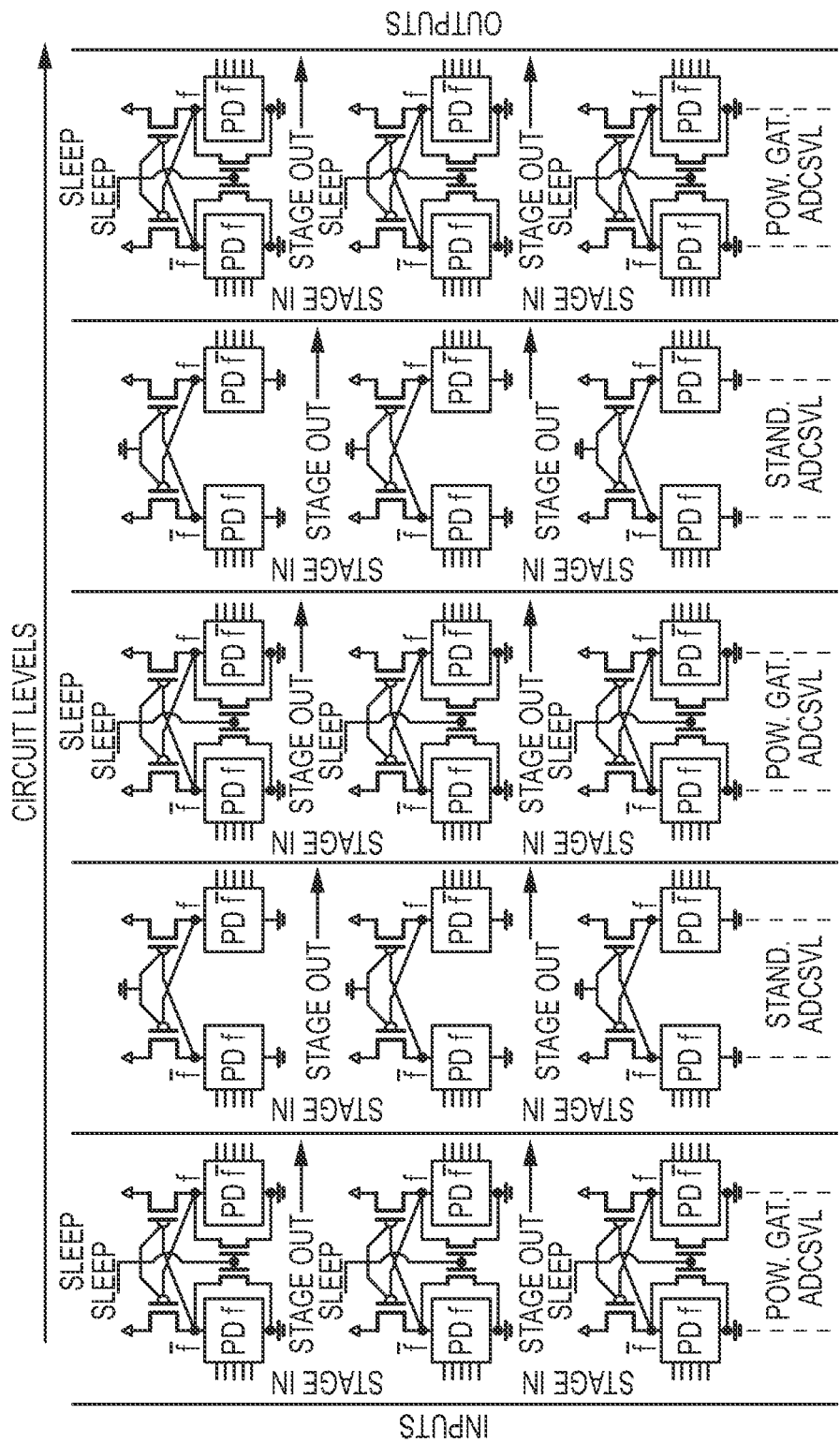
FIG. 12 shows a fully power gated circuit with ADCVSL gates.

The outputs of a proposed ADCVSL power-gated cell are grounded during the standby mode preventing short circuit currents in successive gates. This fact suggests further power gating of successive ADCVSL gates. If a standard ADCVSL gate receives at both real and complementary inputs only 0s, then both PD networks are disconnected from $V_{ss}$. This is equivalent to power gating using footer sleep transistors. Moreover, the static power reduction is even enhanced due to series stacking of transistors in PD networks [10A]. The output of such ADCVSL gate are floating and therefore cannot fed a successive standard ADCVSL gate. Thus, the target circuit must be leveled: power gated and standard ADCVSL gates can be assigned using the alternating scheme shown in FIG. 12.

Double-Gate Controllable Polarity SINWFETS

Figure 13:
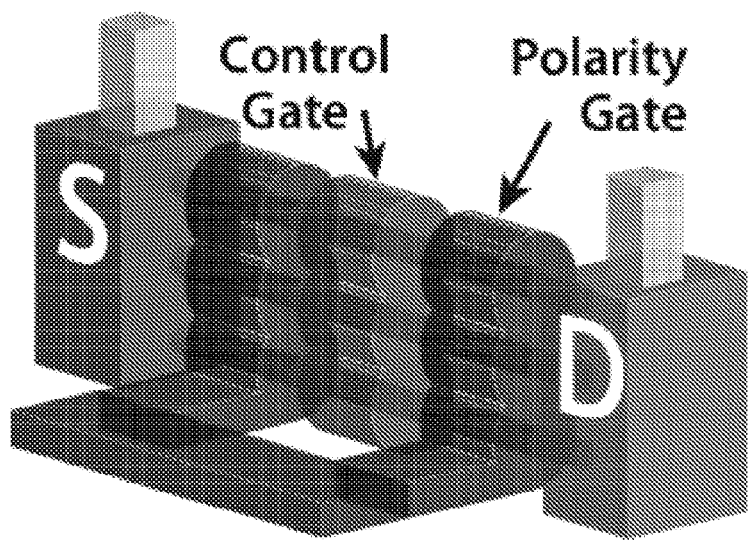
FIG. 13 contains a representation of a conceptual structure of a double-gate controllable polarity transistor with vertically-stacked SiNWs [17]

Double-gate controllable polarity devices, also called ambipolar devices, are transistors whose polarity is electrically configurable via the second gate. This is in contrast to traditional unipolar devices, where the polarity is determined during fabrication by chemical doping. Ambipolar transistor have been successfully fabricated in carbon nanotube [15], graphene [16] and Silicon NanoWire (SiNW) [17] technologies. As the natural evolution of FinFET structure, vertically-stacked SiNWs are a promising platform for DG controllable polarity devices thanks to their high Ion/Ioff ratio and CMOS compatible fabrication process. Such device, depicted in FIG. 13, consists of three vertically stacked SiNWs and three gated regions. The side regions are tied together to the Polarity Gate (PG) while the central region is tied to the Control Gate (CG).

Figure 14:
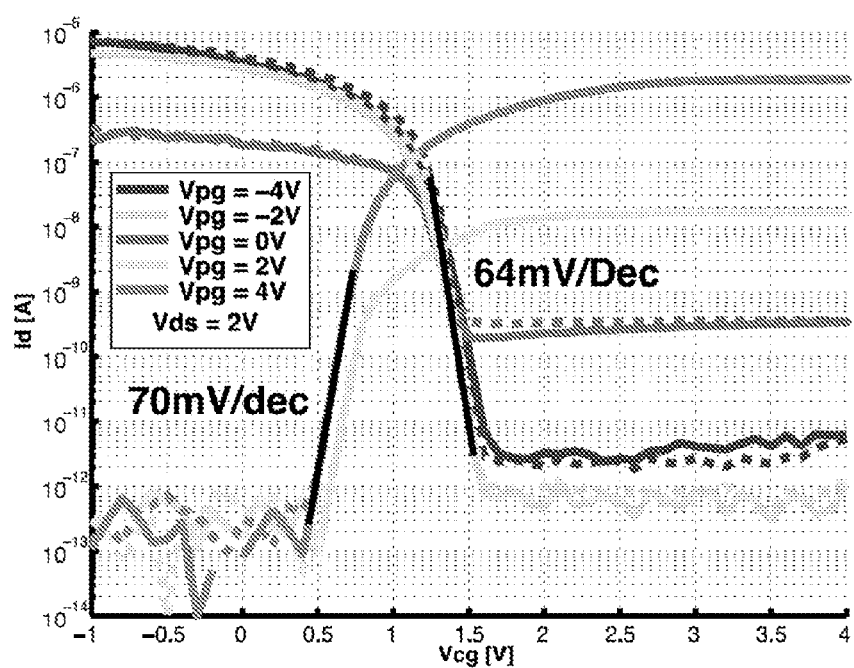
FIG. 14 contains a logarithmic I-Vcg plot for a fabricated 100 nm gate long controllable polarity DG-SiNWFETs [17]

The PG tunes the Schottky barriers at the S/D junctions choosing the channel carriers type (VPG=Vdd) n-type, VPG=Vss) p-type) while the control gate modulates the amount of carriers flowing into the channel. FIG. 14 shows the logarithmic I-V plot for a 100 nm gate long fabricated Ambipolar DG-SiNWFET in [17].

Figure 15A:
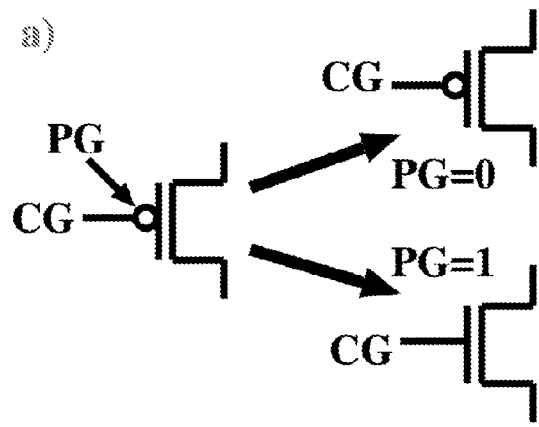
FIG. 15 shows an example ambipolar transistor polarity (re)configuration (a); and full swing XOR logic gate with only 4 ambipolar devices (b)
Figure 15B:
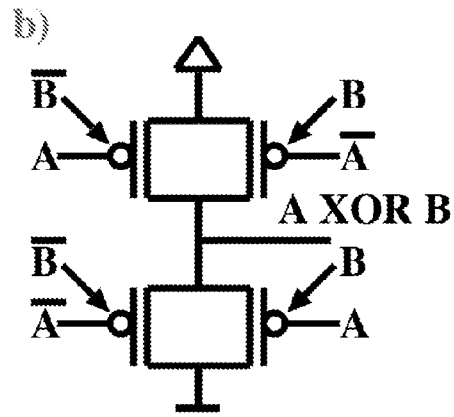

The on-line configuration of n- or p-type polarity in ambipolar transistors is depicted by FIG. 15(a). Such enhanced functionality makes it possible to implement XOR-based logic gates with fewer resources as compared to traditional unipolar devices. FIG. 15(b) depicts a XOR-2 logic gate implemented with only 4 ambipolar devices. The standard CMOS counterpart employs 2× more devices, input inverters apart.

Figure 16:
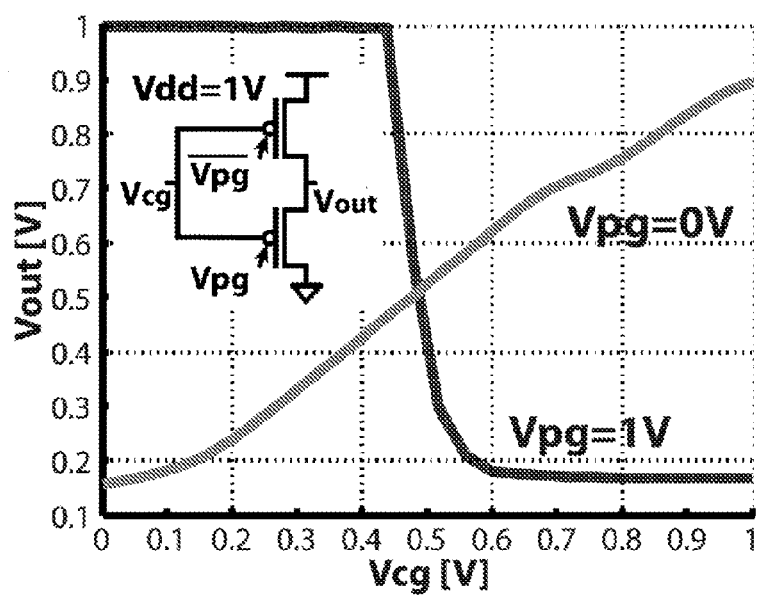
FIG. 16 contains an output characteristic of reduced voltage swing XOR-2 gate fabricated in [17]. The XOR-2 gate employs only two ambipolar DG-SiNWFETs.
Figure 17:
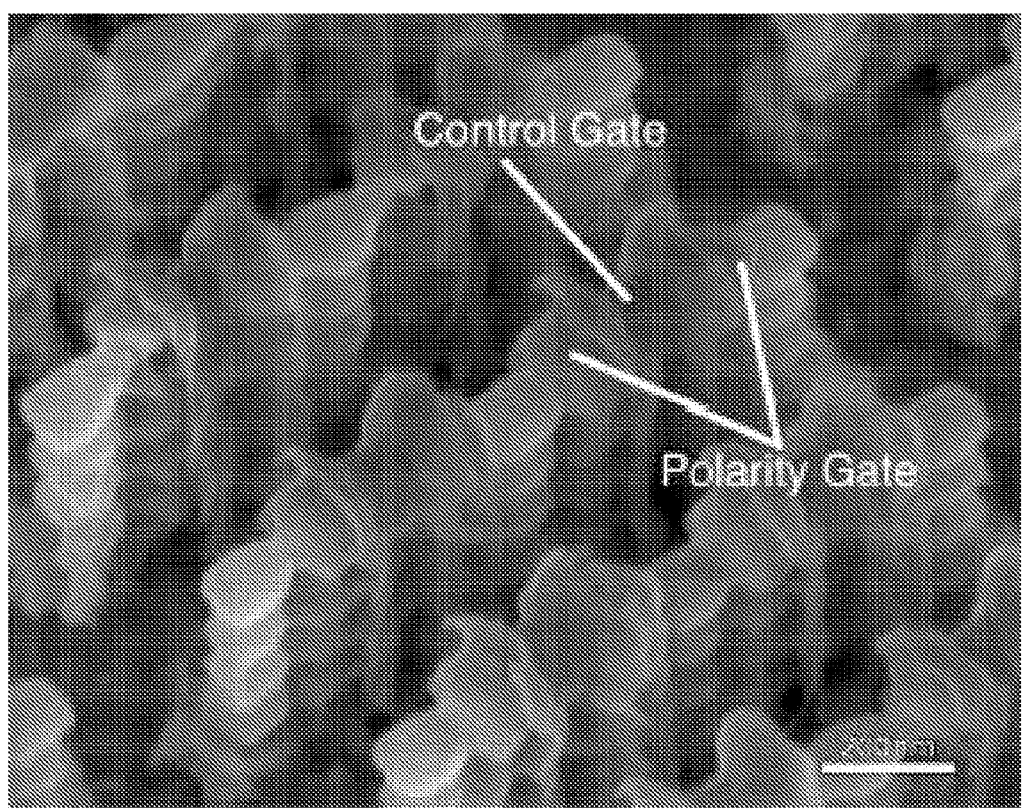
FIG. 17 shows a fabricated ambipolar DG-SiNWFETs.

In [17], a reduced voltage swing XOR-2 logic gate employing only 2 ambipolar DG-SiNWFETs (half of the XOR-2 gate in FIG. 15(b)) has been fabricated and measured. FIG. 16 depicts the characterization results for the reduced voltage swing Ambipolar XOR-2 gate, confirming its expected logic operation. FIG. 17 shows an array of fabricated devices.

The invention claimed is:

1. A logic gate with three inputs A, B, and C, and one output implementing a function MAJ(A,B,C)=A*B+B*C+A*C comprising
    two mutually exclusive transmission gates (TGs) connected in series, based on two parallel double-gate controllable polarity devices, a polarity of each being controlled by input A and a conduction being controlled by input B, or vice-versa, in opposite polarities, and that route either an input A or C from one side of the transmission gates to the output implementing the function MAJ(A,B,C) =A*B+B*C+A*C.

2. The logic gate of claim 1, wherein the output is a node where the two transmission gates are connected.

3. The logic gate of claim 1, wherein the two transmission gates are replaced by pass gates (PGs) based on single double-gate controllable polarity devices controlled by inputs A and B.

4. A Full-Adder comprising a XOR-3 gate and the logic gate of claim 1, wherein the XOR-3 gate is based on further transmission gates (TGs) that route either the input C or an input C' from one side of the further transmission gates to a further output.

5. The Full-Adder of claim 3, wherein the further output is a node where the two further transmission gates are connected.

6. The Full-Adder of claim 4, wherein the two transmission gates are replaced by Pass-Gates (PGs) based on controllable polarity double-gate devices.

7. A vertically stack implementation of Full-Adders described in claim 4, wherein the double-gate controllable polarity devices for XOR-3 and majority are vertically stacked and sharing the same gate-input signals.

8. A circuit in Differential Cascade Voltage Switch Logic (DCVSL) style, presenting power gating capabilities, comprising:
    two mutually exclusive pull-down networks, each consisting of either standard unipolar or double-gate controllable polarity devices;
    two n-type transistors driven by a sleep signal, placed in parallel to the pull-down networks; and
    two double-gate controllable polarity transistors used as pull-up devices, wherein the first gate is used for the standard differential logic feedback and the second gate is driven by a sleep signal.

9. A cascade implementation of power-gated circuits comprising an alternating use of the circuit according to claim 8 and standard non-power-gated DCVSL style circuits.

* * * * *